United States Patent [19]

Caldwell

[11] 4,373,252
[45] Feb. 15, 1983

[54] METHOD FOR MANUFACTURING A SEMICONDUCTOR STRUCTURE HAVING REDUCED LATERAL SPACING BETWEEN BURIED REGIONS

[75] Inventor: Robert E. Caldwell, Mountain View, Calif.

[73] Assignee: Fairchild Camera & Instrument, Mountain View, Calif.

[21] Appl. No.: 234,289

[22] Filed: Feb. 17, 1981

[51] Int. Cl.³ .............. H07L 21/263; H01L 27/04
[52] U.S. Cl. ............................... 29/576 B; 29/571; 148/1.5; 148/187; 357/49; 357/52; 357/91
[58] Field of Search ............... 148/1.5, 187; 29/571, 29/576 B; 357/49, 52, 91

[56] References Cited

U.S. PATENT DOCUMENTS

| | | | |
|---|---|---|---|
| 3,648,125 | 3/1972 | Peltzer | 317/235 |
| 3,789,504 | 2/1974 | Jaddam | 29/571 |
| 3,945,857 | 3/1976 | Schinella | 148/1.5 |
| 3,962,717 | 6/1976 | O'Brien | 357/44 |
| 4,005,453 | 1/1977 | Le Can et al. | 357/49 |
| 4,066,473 | 1/1978 | O'Brien | 148/1.5 |
| 4,115,797 | 9/1978 | Hingarh et al. | 357/46 |
| 4,172,291 | 10/1979 | Owens | 365/218 |
| 4,182,636 | 1/1980 | Dennard et al. | 148/187 |
| 4,197,143 | 4/1980 | Berry | 148/1.5 |
| 4,261,763 | 4/1981 | Kumar et al. | 148/1.5 |

*Primary Examiner*—Upendra Roy
*Attorney, Agent, or Firm*—Kenneth Olsen; Michael J. Pollock; Theodore Scott Park

[57] ABSTRACT

The lateral spacing between buried regions separated by oxide-isolation regions in a semiconductor structure is reduced to as little as one micron by performing a deep implantation of ions of the conductivity type opposite to that of the buried regions generally into portions of the substrate below the sites where the oxide-isolation regions are formed.

6 Claims, 8 Drawing Figures

METHOD FOR MANUFACTURING A SEMICONDUCTOR STRUCTURE HAVING REDUCED LATERAL SPACING BETWEEN BURIED REGIONS

BACKGROUND OF THE INVENTION

1. Field of the Invention

This invention relates generally to methods for manufacturing semiconductor devices. More particularly, this invention relates to techniques for fabricating semiconductor structures having reduced lateral spacing between buried regions.

2. Description of the Prior Art

The Isoplanar process as disclosed by D. Peltzer in U.S. Pat. No. 3,648,125, "Method of Fabricating Integrated Circuits with Oxidized Isolation and the Resulting Structure," in which the active areas of a semiconductor wafer are separated by oxide-isolation regions has provided a significant advancement in the semiconductor manufacturing art. In accordance with the techniques disclosed by Peltzer, N-type collector/emitter regions are first formed laterally apart from one another adjacent to the top surface of a P-type semiconductor substrate. An epitaxial layer of, for example, P-type conductivity is then grown over the top surface of the substrate so that the N-type collector/emitter regions become buried regions. Grooves are then formed in the epitaxial layer at locations above portions of the substrate lying between the buried regions. The grooves are exposed to an appropriate oxidizing environment to grow electrically insulating oxide-isolation regions of silicon dioxide which extend down to the buried regions. Various other N-type and P-type regions are then formed in the remainder of the epitaxial layer to create whatever devices are desired. The oxide-isolation regions electrically isolate the devices formed in the portion of the epitaxial layer above one buried region from the devices formed in the portions of the epitaxial layer above the other buried regions.

One of the problems involved in the Isoplanar oxide-isolation process is that inversion may occur in a portion of the substrate between a pair of buried regions directly below an oxide-isolation region. That is, P-type silicon under an oxide-isolation region and between buried N-type regions may be converted to N-type silicon so as to destroy the electrical isolation between the respective buried N-type regions.

Such inversion is conventionally prevented by doping the portions of the P-type substrate directly below the oxide-isolation regions and between the buried N-type regions with a higher concentration of a P-type impurity such as boron to form "anti-inversion regions." D. O'Brien discloses one method for forming anti-inversion regions in U.S. Pat. No. 3,962,717, "Oxide Isolated Integrated Injection Logic with Selective Guard Ring." According to O'Brien, a P-type impurity is predeposited to a shallow depth in the grooves used for forming the oxide-isolation regions. As the oxide-isolation regions are grown, the predeposited P-type impurity moves ahead of the advancing silicon/silicon-dioxide interface so as to form anti-inversion regions between the buried regions. A characteristic of the O'Brien method is that the anti-inversion regions extend up the sidewalls of the oxide-isolation regions. Where the epitaxial layer is N-type, this may be disadvantageous because portions of the epitaxial layer along the sidewalls must sometimes be further doped with an N-type impurity, necessitating an extra masking step. Furthermore, the anti-inversion regions of O'Brien do not penetrate sufficiently deep into the gaps between each pair of buried regions to materially affect the breakdown voltage between buried regions. Consequently, the lateral spacing between buried regions determines the breakdown voltage and typically must be about three microns to provide a suitably high breakdown voltage.

Another method for preventing inversion below the oxide-isolation regions is to use a substrate having a substantially higher concentration of P-type dopant. This solution, however, results in a substrate-to-buried region capacitance that is often unacceptably high.

It is known that a bipolar transistor can be formed by various up-diffused base processes. For example, a P-type impurity such as boron may be introduced to a shallow depth into the top surface of a P-type substrate containing an N-type region extending to a greater depth into the substrate from its top surface. An N-type epitaxial layer is then grown on the top surface of the substrate. During the growth of the epitaxial layer and during subsequent high-temperature steps, the P-type impurity diffuses upward into the epitaxial layer to form a P-type region beginning approximately at the top surface of the substrate and extending into the N-type epitaxial layer. The up-diffused P-type region comprises the base for an NPN transistor, while the N-type buried region and the N-type epitaxial layer form the emitter and collector, respectively.

SUMMARY OF THE INVENTION

In accordance with the invention, a process is disclosed for fabricating a semiconductor structure having reduced lateral spacing between buried regions. This process is applicable to the manufacture of random-access memories, programmable read-only memories and numerous other semiconductor devices where oxide-isolation techniques or similar techniques are employed for separating the active areas of a semiconductor wafer.

The starting material is a semiconductor substrate of a first conductivity type having an electrically insulating layer along the upper surface of the substrate. A plurality of holes laterally spaced apart from one another are formed through the insulating layer down to the upper substrate surface. A semiconductor dopant of a second conductivity type opposite to the first conductivity type is introduced through the holes into the substrate to form a like plurality of doped regions of the second conductivity type. After removing the remainder of the insulating layer, ions of a chemical species of the first conductivity type are implanted at selected dosage through the upper substrate surface to form more highly doped regions of the first conductivity type between the doped regions of the second conductivity type. Preferably, the substrate is P-type silicon, and the implanted ions are double charged boron ions.

An epitaxial layer is then grown on the upper substrate surface. At this point, the doped regions of the second conductivity type become buried regions. One or more grooves are formed in portions of the epitaxial layer overlying portions of the substrate between each pair of buried regions. The surface area of the epitaxial layer exposed by the grooves is then exposed to a selected oxidizing environment to form electrically insulating regions which extend down into the substrate between adjacent buried regions and serve to define the active semiconductor regions. In particular, the insulating regions extend down to the more highly doped regions of the first conductivity type.

The implant dosage for forming the more highly doped regions is sufficiently high that no inversion occurs in the more highly doped regions adjacent to and under the insulating regions. Accordingly, these more highly doped regions act as anti-inversion regions which, in combination with the insulating regions, electrically isolate the buried regions from one another.

Additionally, the implant depth is sufficiently great so that the implanted ions do not diffuse upward into the epitaxial layer during its formation. Nor is there any significant diffusion into the epitaxial layer during subsequent high temperature steps. The implanted ions do diffuse upward and downward within the buried regions during subsequent high-temperature steps. However, the implant dosage is sufficiently low that the buried regions are entirely of the second conductivity type after the subsequent high-temperature steps.

An advantage of the foregoing procedure is that the lateral spacing between buried regions may be as low as one micron. This is about two microns less than that achievable with prior art processes. Reduced lateral spacing results because the more highly doped regions provide lower resistivity between buried regions so as to maintain the breakdown voltage at the suitably high level while the buried regions come closer to one another.

A further advantage of the invention is that the more highly doped regions do not extend up the sidewalls of the insulating regions. As a consequence, it is not necessary to introduce a compensating dopant of the second conductivity type into the epitaxial layer along the sidewalls of the insulating regions as is often necessary when the anti-inversion regions extend up the sidewalls of the oxide-isolation regions.

In an alternative embodiment, a field predeposition of the type described by O'Brien in U.S. Pat. No. 3,962,717, above, is also performed after formation of the grooves so as to create anti-inversion regions of the conventional type. Inversion is prevented and lateral spacing is reduced between buried regions by the combination of anti-inversion regions and the implanted more highly doped regions. This alternative is advantageous when sidewall regions of the first conductivity type are desired such as for sidewall resistors.

BRIEF DESCRIPTION OF THE DRAWINGS

Like reference symbols are employed in the drawings and in the description of the preferred embodiments to represent the same item or items in the drawings and in the description of the preferred embodiments.

DESCRIPTION OF THE PREFERRED EMBODIMENTS

Conventional photomasking, cleaning, and annealing techniques, which are well-known in the prior art, are employed in the following description for manufacturing a semiconductor structure having reduced lateral spacing between buried regions. Accordingly, no references are made to the steps involved in creating a mask of photoresist or to the cleaning and annealing steps. All operations, except ion implantations, are performed at atmospheric pressure. Ion implantations are performed under conventional vacuum conditions.

Boron is generally used as the P-type impurity (or dopant) for creating the various regions of P-type conductivity in or on a semiconductor wafer. Antimony, phosphorous, and arsenic are employed selectively as complementary N-type impurities for creating the N-type regions. Other appropriate impurities may be utilized in place of the foregoing dopants.

Directional adjectives such as "upper", "lower", "top", and "bottom" are used solely for describing the invention with respect to a semiconductor wafer lying flat and substantially parallel to the ground as viewed from the side. "Lateral" or "horizontal" refers to direction generally along a direction parallel to the plane in which (the substantially flat bottom surface of) the wafer lies, while "vertical" refers to a direction generally orthogonal to the plane of the wafer.

Figure 1A:
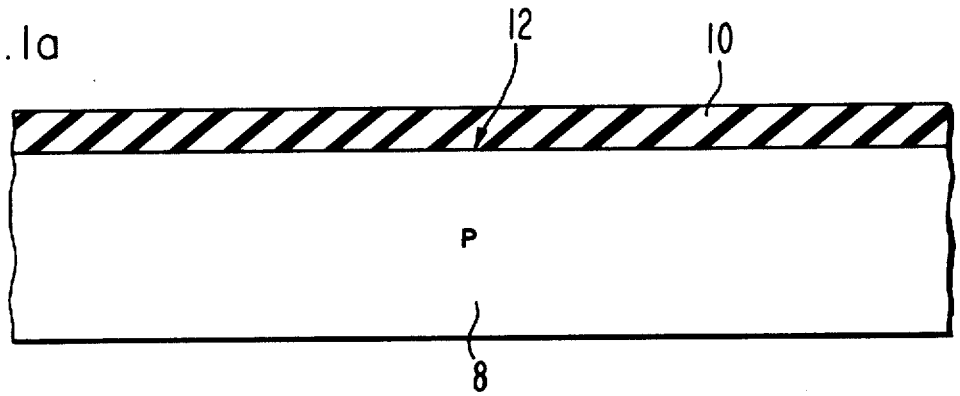
FIGS. 1a-1f and 1f' are cross-sectional views illustrating steps in the fabrication of a semiconductor structure having reduced lateral spacing between buried regions in accordance with the invention.

Referring to the drawings, FIGS. 1a-1f and 1f' illustrate steps in manufacturing a semiconductor structure having reduced lateral spacing between buried regions. As shown in FIG. 1a, the starting material is a substrate 8 of P-type silicon having a resistivity of 1.5-3 ohm-centimeters. Initially, an electrically insulating layer 10 of silicon dioxide is formed on the top surface 12 of substrate 8. Oxide layer 10 has a thickness of approximately 8,000 angstroms.

A plurality of holes spaced apart from one another are etched through oxide layer 10 by exposing it for about ten minutes through corresponding openings in a photoresist mask formed on the top surface of oxide layer 10 to a buffered etchant consisting of one part of electronic-grade hydrofluoric acid and six parts of a solution of 40 weight percent ammonium fluoride in water (hereafter "buffered hydrofluoric acid"). This plurality of holes, of which holes 14, 16, and 18 in FIG. 1a are representative, serves to define the locations for a corresponding plurality of buried regions.

Figure 1B:
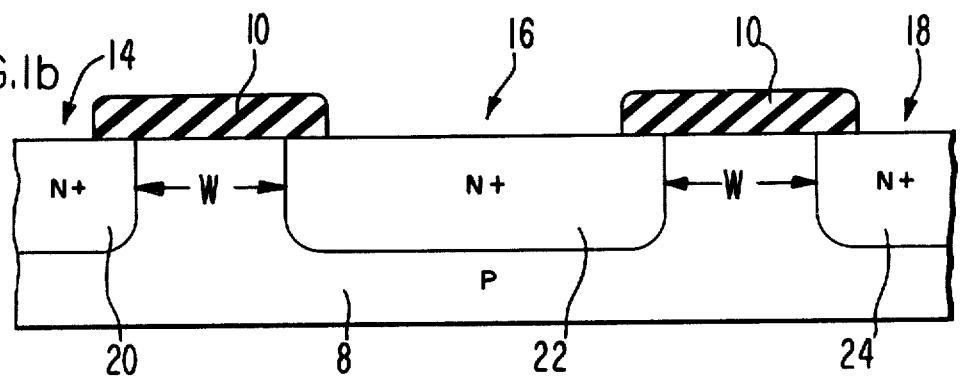

After removing the photoresist mask, an N-type impurity, antimony from a $Sb_2O_3$ source, is diffused through holes 14, 16, and 18 at a temperature of 1250° C. to form N+ regions 20, 22, and 24, respectively, spaced apart from one another as depicted in FIG. 1b. Each of N+ regions 20, 22, and 24 has a sheet resistance of approximately 25-40 ohms/square and a depth (or thickness) of about 25,000 angstroms. The lateral spacing W between each pair of N+ regions 20, 22, and 24 nearest to each other—e.g., spacing W between N+ regions 20 and 22 or between N+ regions 22 and 24—is about 1 micron.

The remaining portions of oxide layer 10 are stripped away by submerging the wafer in electronic-grade hydrofluoric acid for about 5 minutes. The upper surface 12 of the resulting substructure is thereby exposed.

Figure 1C:
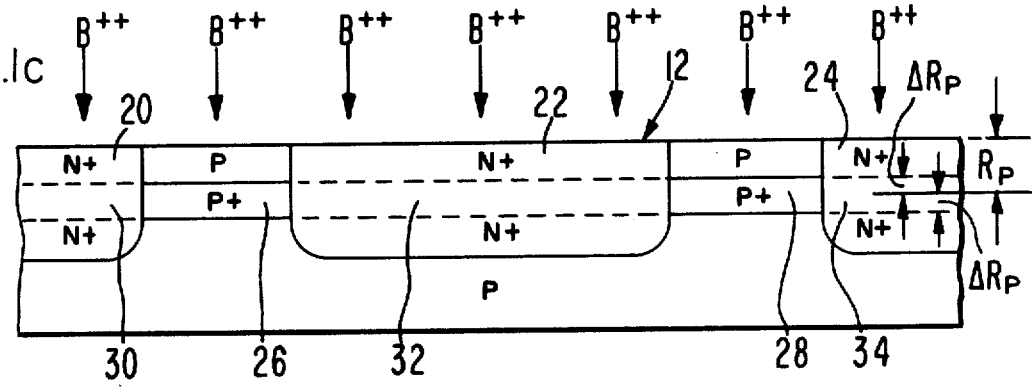

As shown in FIG. 1c, a P-type dopant, boron in the form of B++, is ion implanted through upper surface 12 into the underlying silicon. The implant dosage is in the range of $5 \times 10^{12}$ to $1 \times 10^{14}$ ions/centimeter$^2$ at an energy level of 50-600 kiloelectron volts, so that the mean implant depth $R_P$ of the boron ions into the underlying silicon is 1,500-20,000 angstroms. Preferably, the boron implant dosage is $1 \times 10^{13}$ ions centimeter$^2$ at an energy level of 200 kiloelectron volts which leads to mean implant depth $R_P$ of about 10,000 angstroms. The distribution of the resultant boron atoms is approximately Gaussian as a function of vertical distance from top surface 12. The direction of implantation is generally orthogonal to the plane of the wafer—i.e., no more than 7 degrees from the vertical.

As a result of this implantation, a more highly doped P+ region 26 is formed in a portion of substrate 8 located between N+ regions 20 and 22, and a more highly doped P+ region 28 is likewise formed in a portion of substrate 8 between N+ regions 22 and 24. Boron ions also penetrate into N+ regions 20, 22, and 24 as indicated by dashed-line regions 30, 32, and 34, respectively, in FIG. 1c. The upper and lower boundaries for implanted regions 26, 28, 30, 32, and 34 indicate the distances to about one implant standard deviation $\Delta R_P$ from mean depth $R_P$. The conductivity type of implanted regions 30, 32, and 34 is not indicated in FIG. 1c since parts or all of them may be of P-type conductivity at this stage in the manufacturing process.

Figure 1D:
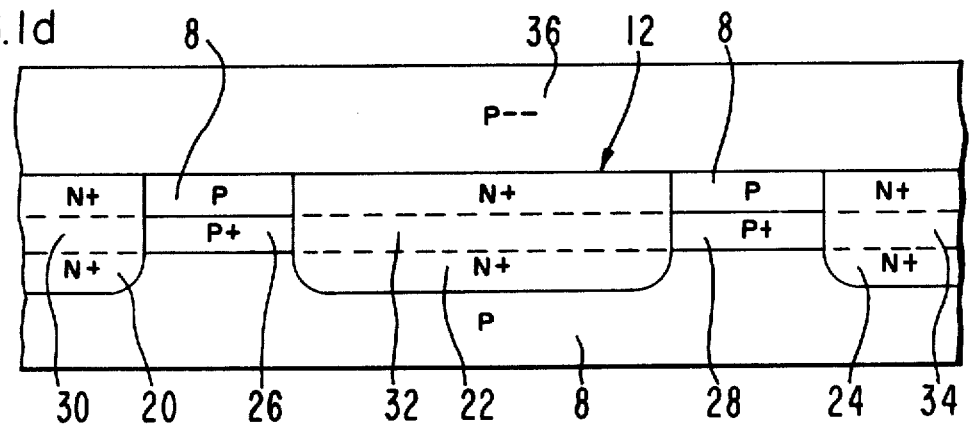

An epitaxial layer 36 is grown from silane or dichlorosilane according to conventional techniques on upper surface 12 of substrate 8. Epitaxial layer 36 may be either P-type silicon, N-type silicon or intrinsic silicon depending on the final application of the semiconductor structure. Epitaxial layer 36 is illustrated in FIG. 1d as a P—layer having a resistivity greater than 10 ohm-centimeters and a thickness of 14,000-16,000 angstroms. The implant depth of the boron ions in P+ regions 26 and 28 (and in regions 30, 32, and 34 as well) is sufficiently great that the implanted boron ions do not out diffuse into epitaxial layer 36 during its formation. N+ regions 20, 22, and 24 are now buried regions which can act as buried emitters or buried collectors.

Figure 1E:
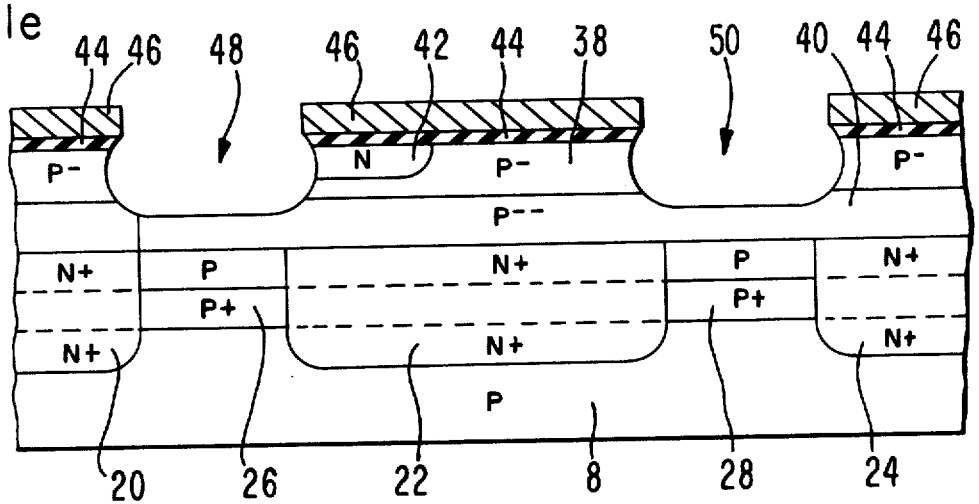

Depending on the desired final usage, various N-type or P-type regions are formed in epitaxial layer 36 prior to the formation of oxide-isolation regions for separating the active areas of the wafer from one another. For example, as illustrated in FIG. 1e, a P-type dopant, boron, may be implanted into the upper portion of epitaxial layer 36 to form a P- layer 38 having a sheet resistance of 9000 ohms/square. The remaining portion of P—layer 36 is illustrated as P—layer 40. An N-type dopant, phosphorous, may then be selectively implanted into the upper part of P- layer 38 to form N region 42 having a sheet resistance of about 130–140 ohms/square. If desired, no further N-type or P-type regions are formed in epitaxial layer 36.

Steps of the type disclosed by Peltzer in U.S. Pat. No. 3,648,125, which is specifically incorporated by reference herein, are now undertaken to form oxide-isolation regions. Utilizing the embodiment of FIG. 1e, the top surface of the wafer is exposed to dry oxygen for 10 minutes at 1000° C. to create an electrically insulating layer 44 of silicon dioxide having a thickness of 200–400 angstroms. An electrically insulating layer 46 of silicon nitride is then deposited on the top surface of oxide layer 44. Nitride layer 46 has a thickness of 1500–1800 angstroms.

Grooves 48 and 50 which may, for example, be a single annular groove are then formed through insulating layers 46 and 44, through P- layer 38 (and N region 42 as applicable), and partially into P—layer 40 at locations overlying P+ regions 26 and 28, respectively, to demarcate the active semiconductor regions. More particularly, a thin electrically insulating layer of silicon dioxide is formed on the top surface of nitride layer 46 by exposing it to steam at a temperature of 1,000° C. for 60 minutes, and a photoresist mask having openings coinciding with the intended locations for grooves 48 and 50 is formed on the top surface of this oxide layer. The portions of this oxide layer not protected by the photoresist mask are removed by etching for 1 minute with buffered hydrofluoric acid. The underlying portions of nitride layer 46 are removed by etching with boiling electronic-grade phosphoric acid for approximately 60 minutes. After removing the photoresist mask, the silicon dioxide on the remaining portions of nitride layer 46 and on the exposed portions of oxide layer 44 is removed by etching for 1 minute with buffered hydrofluoric acid. Next, grooves 48 and 50 are formed below the areas where oxide layer 44 has been removed by etching the underlying silicon with an iodine buffered etchant formed in the proportions of 27.5 grams of iodine, 5,000 milliliters of electronic-grade acetic acid, 200 milliliters of electronic-grade hydrofluoric acid, and 2,500 milliliters of electronic-grade nitric acid.

Figure 1F:
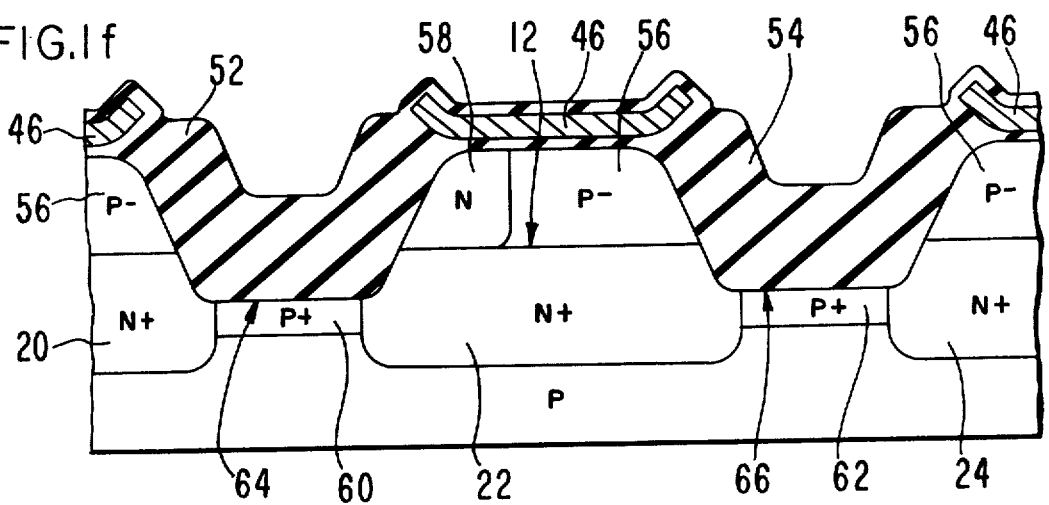
Figure 1F:
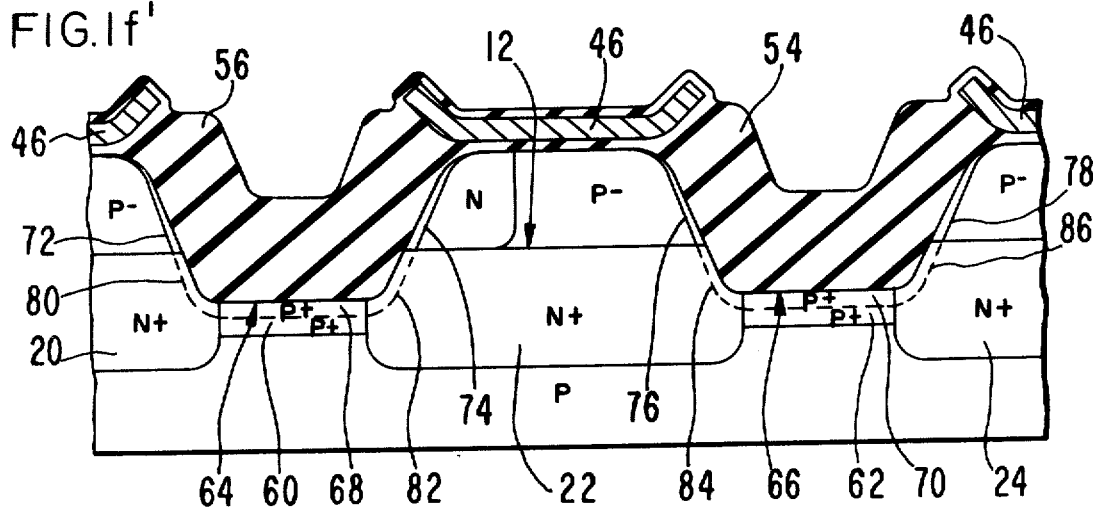

As shown in FIG. 1f, electrically insulating oxide-isolation regions 52 and 54 of silicon dioxide are then formed by exposing the surface area of the silicon exposed by grooves 48 and 50, respectively, to a selected oxidizing environment. Preferably, the silicon adjacent to grooves 48 and 50 is oxidized by exposing it at 1000° C. in oxygen for 90 minutes and then in steam for 720 minutes. During the formation of oxide-isolation regions 52 and 54, the N-type and P-type impurities in P- layer 38 and N region 42 diffuse downward to form P- regions 56 and N region 58, respectively, which share their lower boundaries with upper surface 12. The upper surfaces of the remaining portions of nitride layer 46 also oxide to form thin electrically insulating regions of silicon dioxide of about 500–1000 angstroms thickness.

Oxide-isolation regions 52 and 54 extend downward into the portions of the doped silicon originally comprising implanted P+ regions 26 and 28, respectively. During the oxide-isolation process, the boron ions implanted in P+ regions 26 and 28 diffuse downward slightly to form more highly doped regions 60 and 62, respectively, between buried regions 20, 22, and 24. Items 64 and 66 indicate the lower surfaces of oxide-isolation regions 52 and 54, respectively, and therefore the upper silicon surfaces for P+ regions 60 and 62, respectively. P+ regions 60 and 62 do not extend up the sidewalls of oxide-isolation regions 52 and 54. The resultant net P-type (boron) concentration in P+ regions 60 and 62 generally ranges from $5 \times 10^{16}$ to $5 \times 10^{17}$ atoms/centimeter$^3$ and preferably is in the range of $5 \times 10^{16}$ to $1 \times 10^{17}$ atoms/centimeter$^3$. This is much higher than the P-type concentration of about $6 \times 10^{15}$ atoms/centimeter$^3$ in the doped silicon underlying buried regions 20, 22, and 24. The net P-type dopant concentration in P+ regions 60 and 62 is sufficiently high that no inversion into an N-type region occurs anywhere in P+ regions 60 and 62. Accordingly, P+ regions 60 and 62 in combination with oxide-isolation regions 52 and 54, respectively, electrically isolate buried regions 20, 22, and 24 from one another.

During the oxide-isolation process, the boron ions implanted into buried regions 20, 22, and 24 (and originally forming regions 30, 32, and 34, respectively) diffuse further downward and upward within regions 20, 22, and 24. The resultant concentration of N-type atoms in buried regions 20, 22, and 24 near surface 12 is on the order of $1 \times 10^{19}$ atoms/centimeter$^3$ which is more than a factor of ten greater than the resultant concentration of implanted boron atoms. As a result, all portions of buried regions 20, 22, and 24 are N-type conductivity. Dashed-line regions 30, 32, and 34 are not further indicated in FIG. 1f. A small amount of upward diffusion of boron ions into regions 56 and 58 may occur. This upward diffusion is, however, insufficient to affect the conductivity type anywhere in regions 56 and 58.

P-type anti-inversion guard rings which would be formed around grooves 48 and 50 according to the conventional process described by D. O'Brien in U.S. Pat. No. 3,962,717, cited above, and which eventually become anti-inversion regions located below and, depending upon the particular application, sometimes up the sidewalls of oxide-isolation regions 52 and 54 are preferably not employed. Instead, implanted P+ regions 60 and 62 take the place of anti-inversion regions formed from guard rings around grooves 48 and 50, respectively.

In an alternative embodiment, according to techniques described by O'Brien in U.S. Pat. No. 3,962,717, which is specifically incorporated by reference herein, a P-type impurity, boron from a $BBr_3$ source, is deposited on the surface area forming grooves 48 and 50 prior to the oxide-isolation process and then is driven to a shallow depth into the silicon adjacent to grooves 48 and 50 by a predeposition process to form P+ anti-inversion guard rings around grooves 48 and 50. During the oxide-isolation process, the anti-inversion guard rings diffuse downward and sideward ahead of the advancing silicon/silicon-dioxide interface where silicon is being converted into oxide regions 52 and 54. P+ anti-inversion regions 68 and 70 and the corresponding P+ sidewall portions 72, 74, 76, and 78 as shown in FIG. 1f' are the remaining portions of the anti-inversion guard rings. Dotted lines 80, 82, 84, and 86 indicate the guard ring portions whose P-type concentration is sufficiently low that they remain N-type conductivity. The resulting structure is otherwise the same as that of FIG. 1f. Accordingly, P+ regions 60 and 62 in combination with P+ regions 68 and 70, respectively and oxide-isolation regions 52 and 54, respectively, electrically isolate buried regions 20, 22, and 24 from one another. P+ regions 72, 74, 76, and 78 provide sidewall resistors which are useful in certain applications.

Figure 2:
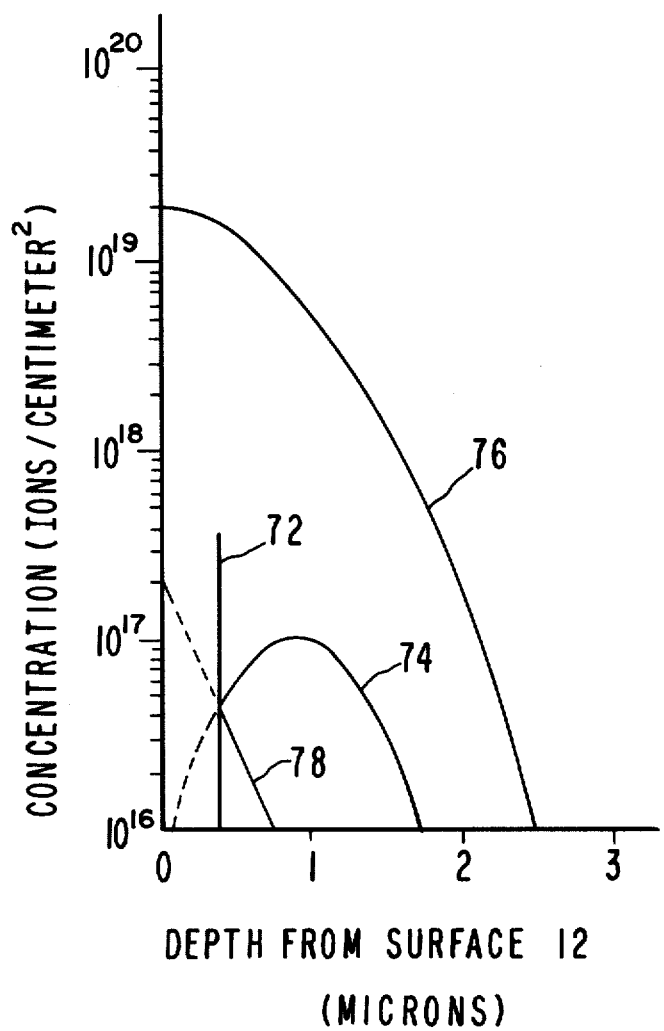
FIG. 2 is a concentration profile for the structure of FIG. 1f or 1f'.

Turning to FIG. 2, it illustrates dopant concentration as a function of depth from surface 12 for FIG. 1f or 1f'. Line 72 indicates the location of bottom surface 64 or 66 of oxide region 52 or 54, respectively. Curve 74 denotes the resultant concentration of the P-type impurity implanted to form P+ region 60 or 62. Curve 76 indicates the resultant concentration of the N-type impurity for buried region 20, 22, or 24. Curve 78 denotes the resultant concentration for the P-type impurity pre-deposited and driven in to form anti-inversion regions 68 and 70 (when used).

The structure shown in either FIG. 1f or FIG. 1f' is now further processed to form additional N-type and P-type regions as desired. For example, this structure could be further processed in accordance with the steps described in U.S. Pat. No. 4,172,291, "Preset Circuit for Information Storage Devices," W. Owens et al.; U.S. Pat. No. 3,945,857, "Method for Fabricating Double Diffused, Lateral Transistors", R. Schinella et al.; or U.S. Pat. No. 4,066,473, "Method of Fabricating High-Gain Transistors," D. O'Brien. Each of these documents is specifically incorporated by reference herein.

While the invention has been described with preference embodimnents, the description is solely for the purpose of illustration and is not construed as limiting the scope of the invention claimed below. For example, semiconductor materials of the opposite conductivity type to those described above may be employed to accomplish the same results. Thus, various modifications, changes and applications may be made by those skilled in the art without departing from the true scope and spirit of the invention as defined by the appended claims.

What is claimed is:

1. In a process for fabricating a semiconductor structure, a method for reducing the lateral spacing between buried regions, the method comprising the steps of:
providing a semiconductor substrate of a first conductivity type having an electrically insulating layer along an upper surface of the substrate;
forming two laterally spaced apart holes through the insulating layer to the upper surface of the substrate;
introducing a semiconductor dopant of a second conductivity type opposite to the first conductivity type through the holes in the insulating layer into the substrate to form two laterally spaced apart doped regions of the second conductivity type in the substrate;
removing the remainder of the insulating layer;
implanting ions of a chemical species of the first conductivity type into the upper surface of the substrate at a selected dosage;
forming an epitaxial layer on the upper surface of the substrate;
forming a groove in a portion of the epitaxial layer overlying that portion of the substrate between the doped regions of the substrate; and
exposing the surface of the epitaxial layer exposed by the groove to a selected oxidizing environment to form an electrically insulating oxidized region which extends down into a portion of the substrate between the doped regions
wherein ions of the chemical species implanted into the surface of the substrate diffuse downwardly during the exposing step to define a more highly doped region of the first conductivity type between the doped regions and adjacent to the oxidized regions, the more highly doped region having a net dopant concentration greater than the net dopant concentration of an adjacent portion of the first conductivity type of the substrate and the selected dosage being sufficiently high such that no inversion into a doped region of the second conductivity type occurs in the more highly doped region, whereby the more highly doped and oxidized regions in combination electrically isolate the doped regions from each other.

2. A method as in claim 1 wherein ions of the chemical species implanted in the substrate further diffuse upward and downward within the doped regions during the step of exposing, the selected dosage not being high enough to cause any portion of either doped region to be of the first conductivity type after the step of oxidizing.

3. A method as in claim 2 and further including, between the steps of forming a groove and exposing the surface area, the step of pre-depositing a semiconductor dopant of the first conductivity type to a shallow depth in the surface area of the epitaxial layer exposed by the groove.

4. A method as in claim 2 or 3 wherein the net dopant concentration in the more highly doped region is approximately in the range of $5 \times 10^{16}$ atoms/centimeter$^3$ to $5 \times 10^{17}$ atoms/centimeter$^3$.

5. A method as in claim 4 wherein the first conductivity type is P-type and the chemical species is boron.

6. A method as in claim 5 wherein the substrate comprises silicon.

* * * * *